(12) United States Patent
Pan

(10) Patent No.: US 7,042,381 B1
(45) Date of Patent: *May 9, 2006

(54) DELAY EQUALIZED Z/2Z LADDER FOR DIGITAL TO ANALOG CONVERSION

(75) Inventor: Hui Pan, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/034,052

(22) Filed: Jan. 13, 2005

Related U.S. Application Data

(60) Provisional application No. 60/622,934, filed on Oct. 29, 2004.

(51) Int. Cl.
*H03M 1/78* (2006.01)
(52) U.S. Cl. .......................... 341/154; 341/153
(58) Field of Classification Search ............... 341/154, 341/153, 118
See application file for complete search history.

(56) References Cited

U.S. PATENT DOCUMENTS

| | | | | |
|---|---|---|---|---|
| 4,751,497 A | * | 6/1988 | Torii | 341/154 |
| 4,920,344 A | * | 4/1990 | Henderson et al. | 341/118 |

OTHER PUBLICATIONS

Seams, Jerry, "R/2R Ladder Networks," Advanced Film Division, AFD006, Sep. 21, 1998, pp. 1-5.
Vorenkamp, P. et al., "WP 3.3: A 1Gs/s, 10b Digital-to Anaog Converter," 1994 IEEE International Solid State Circuits Conference, Feb. 16, 1994, pp. 52-53.

* cited by examiner

*Primary Examiner*—Jean Bruner Jeanglaude
(74) *Attorney, Agent, or Firm*—Sterne, Kessler, Goldstein & Fox P.L.L.C.

(57) ABSTRACT

A Z/2Z ladder network includes an R/2R ladder network having capacitors coupled across series resistors within the R/2R ladder network, wherein the capacitors are sized to substantially match delays from nodes within the ladder network to an output node. The Z/2Z ladder network can be implemented within a digital to analog controller ("DAC"), including higher resolution DACs, and high data rate DACs. In higher resolution DACs, and high data rate DACs, the Z/2Z ladder network is coupled through switches to corresponding current sources. The Z/2Z ladder is optionally implemented differentially.

13 Claims, 8 Drawing Sheets

DELAY EQUALIZED Z/2Z LADDER FOR DIGITAL TO ANALOG CONVERSION

CROSS-REFERENCE TO RELATED APPLICATIONS

This application claims the benefit of U.S. Provisional Application Ser. No. 60/622,934, filed Oct. 29, 2004, titled, "Delay Equalized R-2R Ladder for High Speed, High Resolution Digital-to-Digital Conversion," which is incorporated herein by reference in its entirety.

BACKGROUND OF THE INVENTION

1. Field of the Invention

The invention relates to digital to analog converters ("DACs") and to R/2R ladder networks.

2. Related Art

Conventional DACs use what are known as R/2R ladder networks. Nodes within R/2R ladder networks have associated parasitic capacitances that cause propagation delays through the ladder networks. The propagation delays differ from node to node, which contributes non-linear artifacts in the output waveform. The non-linearities increase with increasing DAC conversion rates.

What are needed therefore are ladder networks that do not have different propagation delays.

SUMMARY OF THE INVENTION

The present invention is directed to ladder networks with equalized propagation delays. A Z/2Z ladder network includes an R/2R ladder network having capacitors coupled across series resistors within the R/2R ladder network, wherein the capacitors are sized to substantially match delays from nodes within the ladder network to an output node. The Z/2Z ladder network can be implemented within a digital-to-analog converter ("DAC"), including higher resolution DACs, and high data rate DACs. In higher resolution DACs, and high data rate DACs, the Z/2Z ladder network is coupled through switches to corresponding current sources. The Z/2Z ladder is optionally implemented differentially.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing summary and the following detailed description are exemplary and explanatory and are intended to provide further explanation of the invention as claimed.

BRIEF DESCRIPTION OF THE DRAWINGS/FIGURES

The present invention will be described with reference to the accompanying drawings, wherein like reference numbers indicate identical or functionally similar elements. Also, the leftmost digit(s) of the reference numbers identify the drawings in which the associated elements are first introduced.

DETAILED DESCRIPTION OF THE INVENTION

I. Introduction

The invention is directed to methods and systems that compensate for parasitic capacitances inherent in R/2R ladder networks. The resultant improved ladder networks are referred to herein as Z/2Z ladder networks.

II. R/2R Ladders

R/2R ladder networks are described in, for example, Application Note AFD006, published by International Resistive Company, Inc., Advanced Film Division, of Corpus Christi, Tex., 1998, which is incorporated herein by reference in its entirety. As described therein, R/2R ladder networks provide a relatively simple, inexpensive way to perform digital to analog conversion (DAC).

Figure 1:
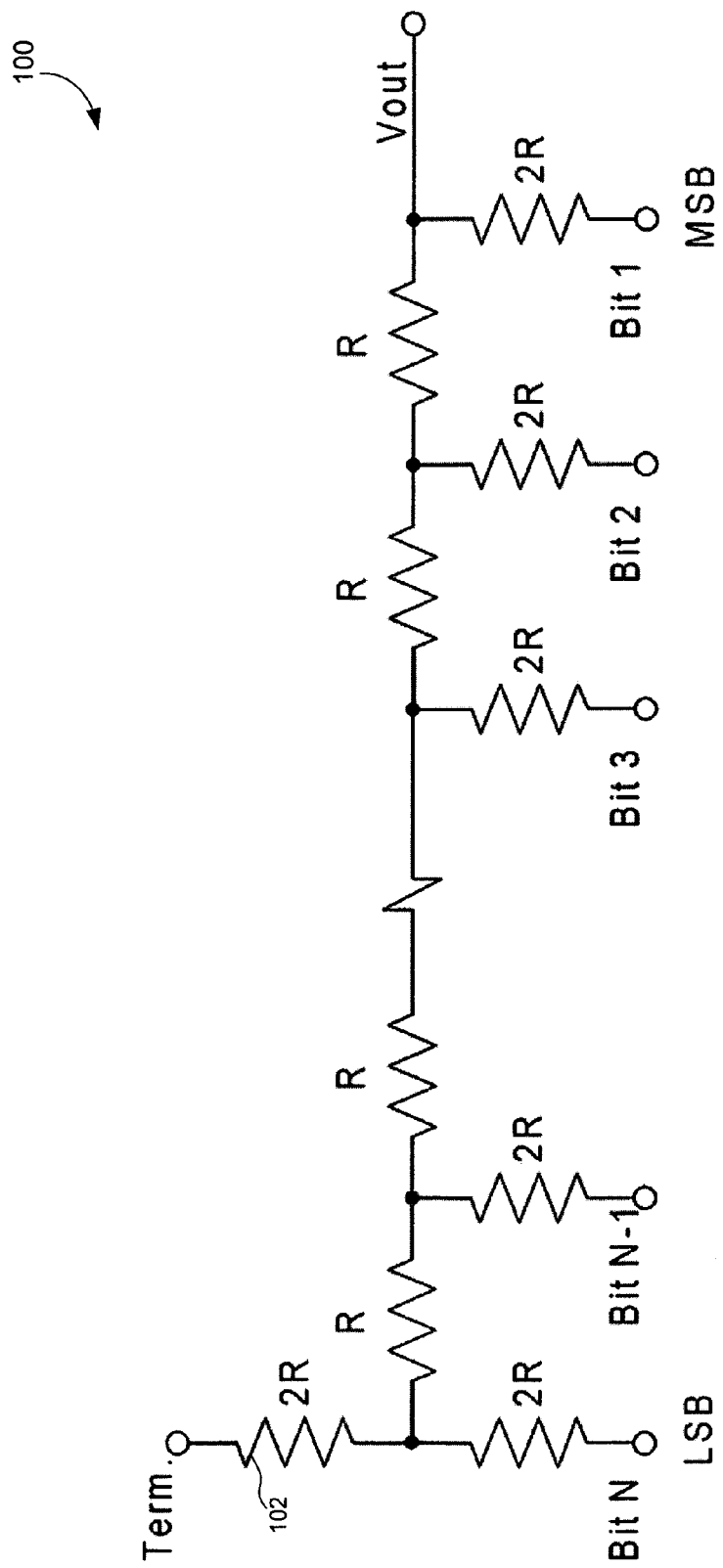
FIG. 1 is a schematic diagram of an R/2R ladder network 100 with N bits.

FIG. 1 is a schematic diagram of an R/2R ladder network 100 with N bits. The "ladder" portrayal comes from the ladder-like topology of the network. The ladder network 100 includes two resistor values, R and 2R (twice the value of R). A termination resistor 102 is connected to ground. The termination resistor 102 assures that the Thevenin resistance of the R/2R ladder network 100, as measured to ground looking in from an output node Vout, with all bits grounded, is R.

Figure 2:
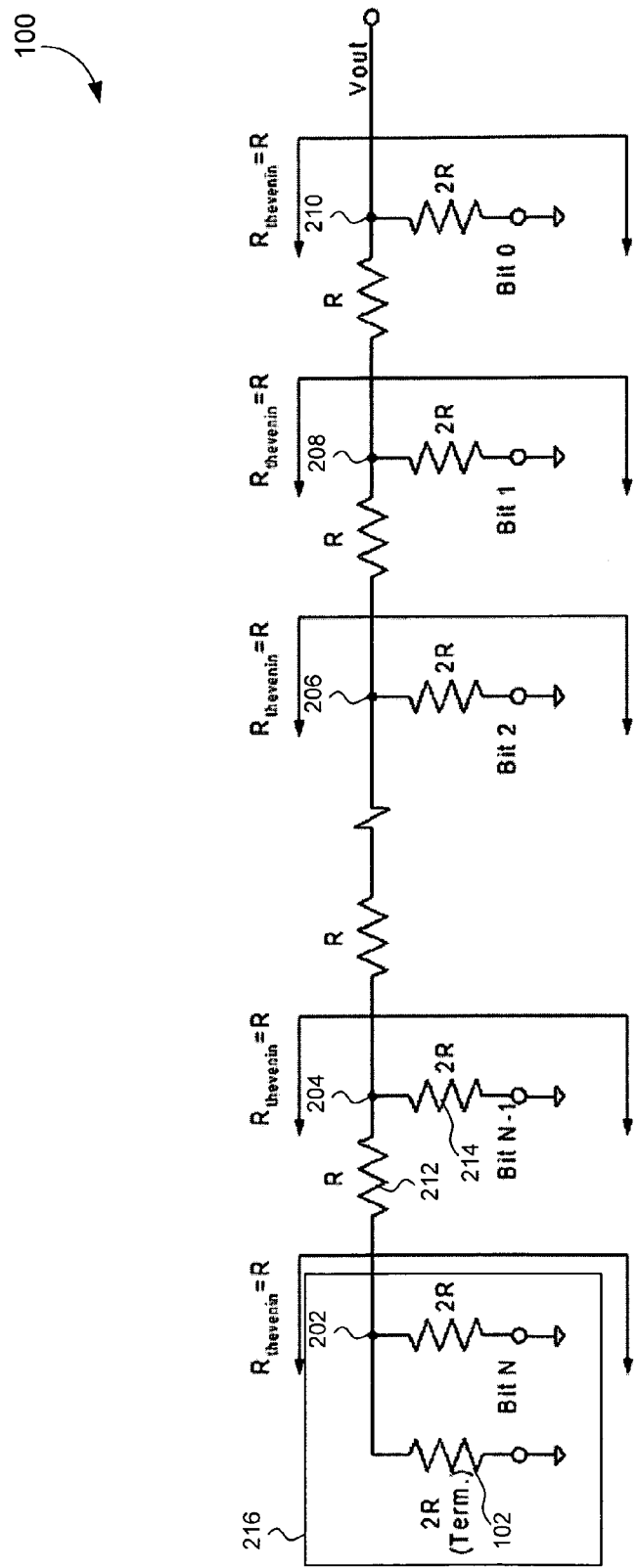
FIG. 2 is a schematic diagram of the R/2R ladder network 100, illustrating the Thevenin resistance of the R/2R ladder.

FIG. 2 is a schematic diagram of the R/2R ladder network 100, illustrating that the Thevenin resistance of the R/2R ladder 100 is R, regardless of the number of bits in the ladder. This is because each node 202 through 210, looking in the direction of the indicated arrows, sees 2R in parallel with 2R. For example, node 202 sees termination resistor 102 as 2R, in parallel with resistor 210, also 2R. This is the equivalent of a single resistor R. The circuit within a portion 216 is thus equivalent to a resistance R. Similarly, node 204 sees the equivalent resistance R of portion 216, in series with resistor 212, for a total of 2R, in parallel with 2R resistor 214. Again, the equivalent resistance of the 2R in parallel with 2R is R.

Figure 3:
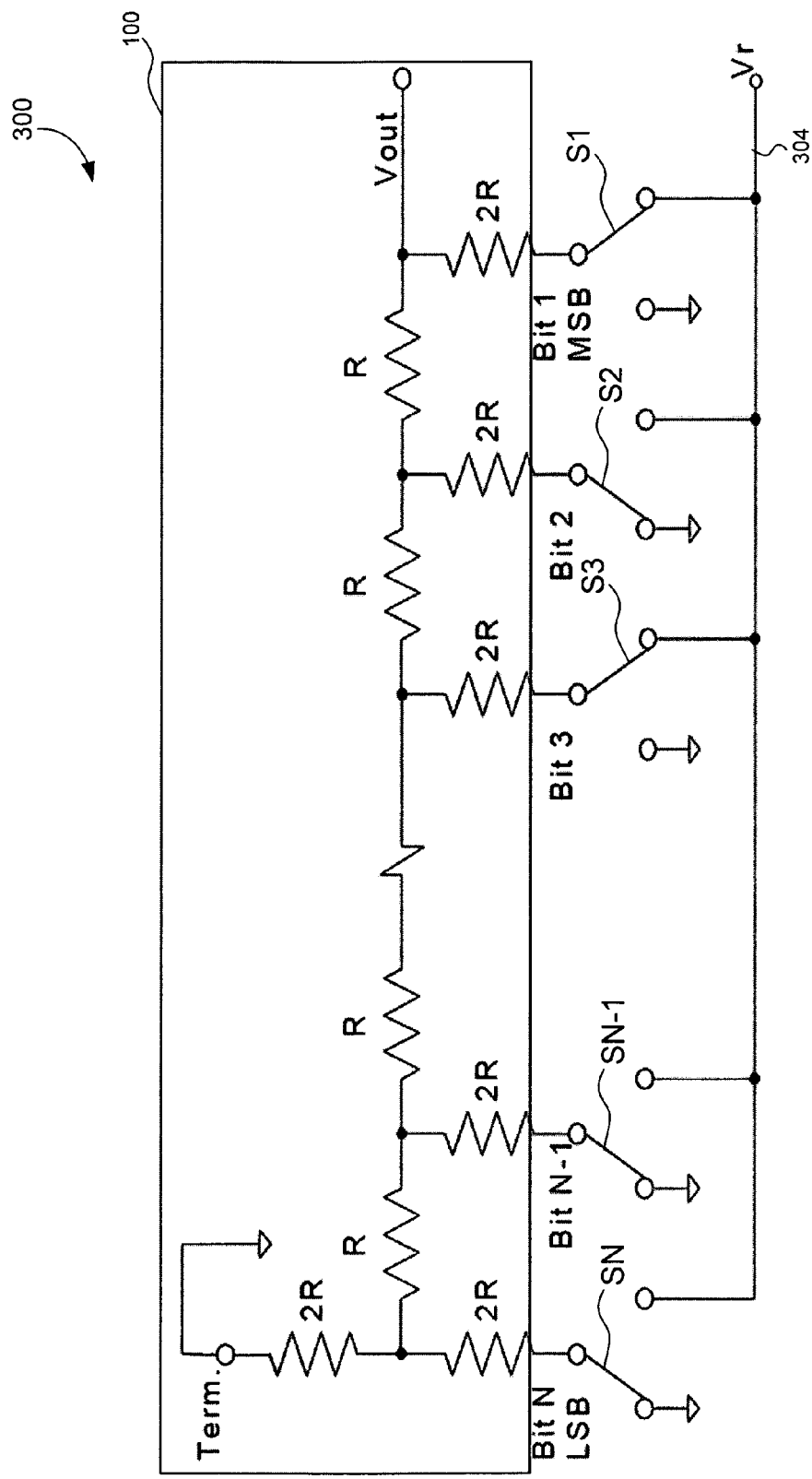
FIG. 3 is a schematic diagram of an example DAC 300 including the R/2R ladder network 100.

FIG. 3 is a schematic diagram of an example DAC 300 including the R/2R ladder network 100. The DAC 300 includes switches S1 through SN. In operation, digital information is presented to the switches S1 through SN as individual bits of a digital word, which switch between a reference voltage (Vr) 302 and ground. Alternatively, as described below, the switches couple to current sources.

Depending on the number and location of the bits switched to Vr or ground, Vout will vary between 0 volts and Vr. When all inputs are connected to ground, 0 volts is produced at Vout. When all inputs are connected to Vr, the output voltage Vout approaches Vr. When some inputs are connected to ground and some to Vr then an output voltage between 0 volts and Vr occurs at Vout.

The digital input bits range from the most significant bit ("MSB") to the least significant bit ("LSB"). As the names indicate, the MSB, when activated, causes the greatest change in the output voltage. The LSB, when activated, will cause the smallest change in the output voltage. Labeling the bits (or inputs) bit 1 to bit N, the output voltage Vout caused by connecting a particular bit to Vr with all other bits grounded is:

$$Vout = Vr/2^N$$

where N is the bit number. For bit 1, Vout=Vr/2, for bit 2, Vout=Vr/4 etc. Table 1 shows the effect of individual bit locations to the Nth bit. Notice that since bit 1 has the greatest effect on the output voltage it is designated the MSB.

TABLE 1

| Bit # | $V_{out}$ |
|---|---|
| 1 MSB | Vr/2 |
| 2 | Vr/4 |
| 3 | Vr/8 |
| 4 | Vr/16 |
| 5 | Vr/32 |
| 6 | Vr/64 |
| 7 | Vr/128 |
| 8 | Vr/256 |
| 9 | Vr/512 |
| 10 | Vr/1024 |
| 11 | Vr/2048 |
| 12 | Vr/4096 |
| N LSB | $Vr/2^N$ |

The R/2R ladder network 100 is a substantially linear circuit. Thus, the principle of superposition can be applied to calculate Vout. Vout is calculated by summing the effect of all bits connected to Vr. For example, if bits 1 and 3 are connected to Vr with all other inputs grounded, the output voltage is calculated by:

$$Vout = (Vr/2) + (Vr/8)$$

which reduces to $$Vout = 5Vr/8.$$

The R/2R ladder 100 is a binary circuit. The effect of each successive bit approaching the LSB is ½ of the previous bit. If this sequence is extended to a ladder of infinite bits, the effect of the LSB on Vout approaches 0. Conversely, the full-scale output of the network (with all bits connected to Vr) approaches Vr as shown in equation (1).

$$\lim_{N \to \infty} (Vr) \sum_{i=1}^{N} \frac{1}{2^i} = Vr \quad (1)$$

The full-scale output is less than Vr for all practical R/2R ladders and, for low pin count devices, the full-scale output voltage can be significantly below the value of Vr. Equation (2) can be used to calculate the full-scale output of an R/2R ladder of N bits.

$$\text{Full Scale Output Voltage} = (Vr) \sum_{i=1}^{N} \frac{1}{2^i} \quad (2)$$

An R/2R ladder of 4 bits would have a full-scale output voltage of ½+¼+⅛+1/16=15Vr/16 or 0.9375 volts (if Vr=1 volt) while a 10 bit R/2R ladder would have a full-scale output voltage of 0.99902 (if Vr=1 volt).

The number of inputs or bits determines the resolution of an R/2R ladder. Since there are two possible states at each input, ground or Vr, (also designated as "0" or "1" in digital lingo for positive logic) there are 2N combinations of Vr and ground to the inputs of an R/2R ladder. The resolution of the ladder is the smallest possible output change for any input change to the ladder and is given by ½N where N is the number of bits. This is the output change that would occur for a change in the least significant bit. For a 10 bit R/2R there are 2N or 1024 possible binary combinations at the inputs. The resolution of the network is 1/1024 or 0.0009766. A change in state at the LSB input should change the output of the ladder by 0.09766% of the full scale output voltage.

The output accuracy of a R/2R ladder is typically specified in terms of full-scale output ± some number of least significant bits. R/2R ladders are usually specified with output accuracies of ±1 LSB or ±½ LSB. For example, a ±½ LSB specification on a 10 bit ladder is exactly the same as ±0.04883% full-scale accuracy.

The ladder function is generally not affected by the value of R, within normal resistance ranges. This would indicate that the absolute tolerances of the resistors making up the ladder are of relatively minimal importance. Accuracy of the ladder is controlled as follows. The ladder operates as an array of voltage dividers whose output accuracies are dependent on how well each resistor is matched to the others. Ideally, resistors within the ladder are matched so that the voltage ratio for a given bit is half of that for the preceding bit.

III. Higher Resolution Digital-to-Analog Converters (DACs)

Higher resolution digital-to-analog converters (DACs) are optionally implemented with coarse and fine segments. This helps to avoid exponential growth of complexity with the increasing resolution, while maintaining an easy matching requirement comparable to the fully-segmented counterpart.

Higher resolution DACs, and higher data rate DACs are taught in, for example, Vorenkamp, P., et al., "A 1 Gs/s, 10b Digital-to-Analog Converter," ISSCC94, Session 3, Analog Techniques, Paper WP 3.3, IEEE International Solid State Circuit Conference, 1994, incorporated herein by reference in its entirety.

The fine segment complexity is further reduced with an array of binary weighted elements directly switched by the binary data bits. The binary current elements are typically realized using an R/2R ladder, such as R/2R ladder network 100.

In the example of FIG. 3, nodes of the R/2R ladder network are selectively coupled to a reference voltage Vr 302 and ground, under control of digital bits that are being converted. For higher speed DACs, current sources are optionally utilized in place of the reference voltage Vr.

Figure 4:
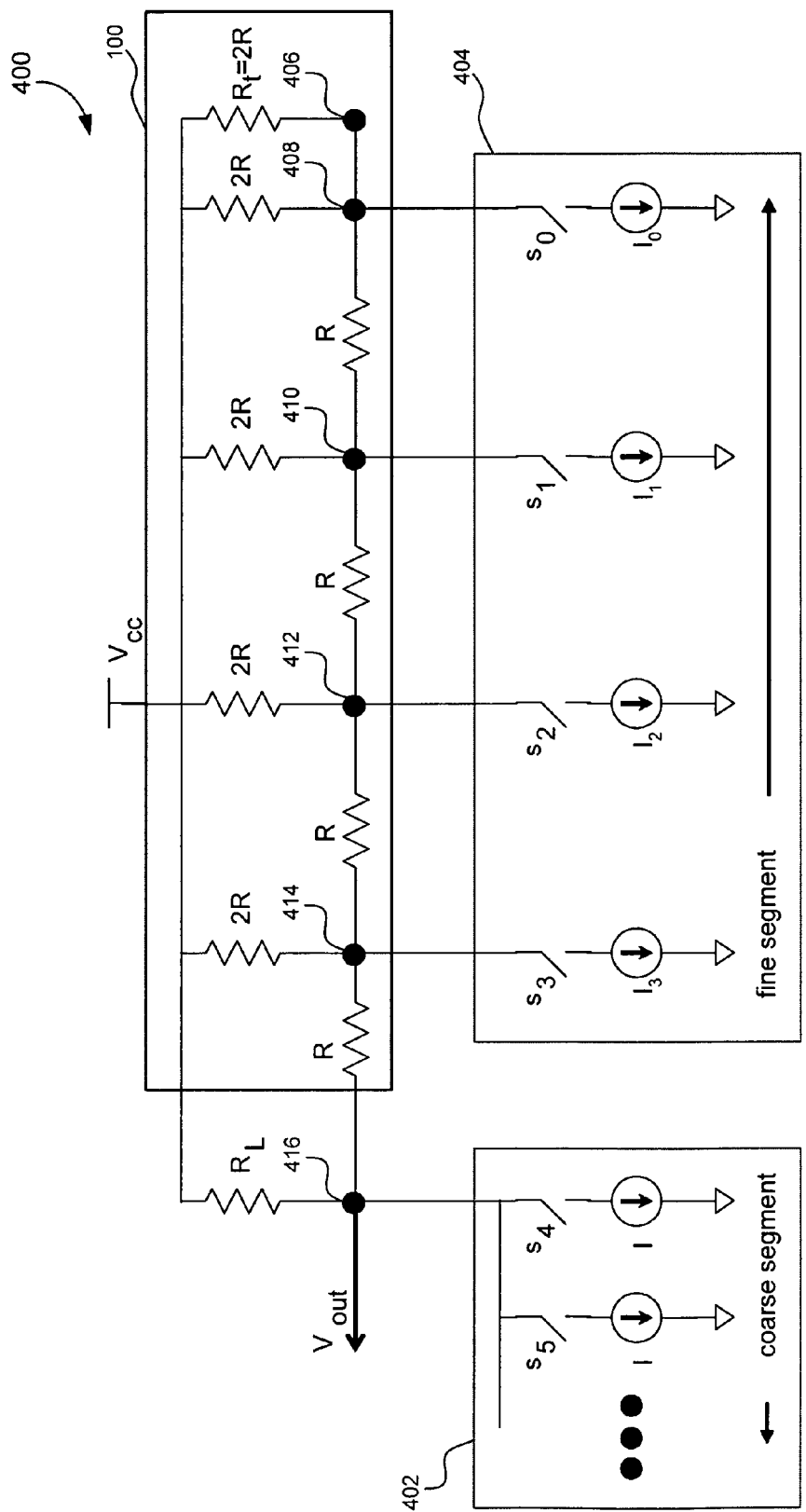
FIG. 4 is a schematic diagram of an example current-switched DAC 400, including the R/2R ladder network 100.

FIG. 4 is a schematic diagram of an example current-switched DAC 400, including the R/2R ladder network 100. The DAC 400 includes a coarse segment 402 and a fine segment 404. The fine segment 404 includes switches S0 through S3, and corresponding unary current sources 10 through 13. Other numbers of switches, and corresponding unary current sources, can be utilized. The fine segment 404 operates substantially similar to the DAC 300.

The coarse segment 402 includes one or more switches, illustrated here as S4 and S5. The switches in coarse segment 402 are controlled indirectly by corresponding more-significant digital bits. For example, in an embodiment, the more-significant bits are converted to a thermometer code, which is used to control the switches in coarse segment 402. Thermometer codes are well known to those skilled in the relevant arts.

In operation, the array of switches couple corresponding unary currents into the R-2R ladder network 100, which generates a different binary weight for each injected unary current. The binary-weighted currents are summed at an output node 416.

IV. Parasitics

The example of FIG. 4 allows for easier matching of the unary current sources. There are, however, parasitic capacitances associated with injection nodes 406 through 416 of the R/2R ladder network 100. For example, the resistors R in the R-2R ladder 100 are typically implemented with unit poly resistors. The resistor size should be large enough to prevent intermodulation spurs arising from resistor self-heating. Larger poly resistors, however, have parasitic capacitances with respect to the IC substrate. Along with other parasitics in the circuit, the total parasitic capacitance at each node can easily reach tens of fF.

Figure 5:
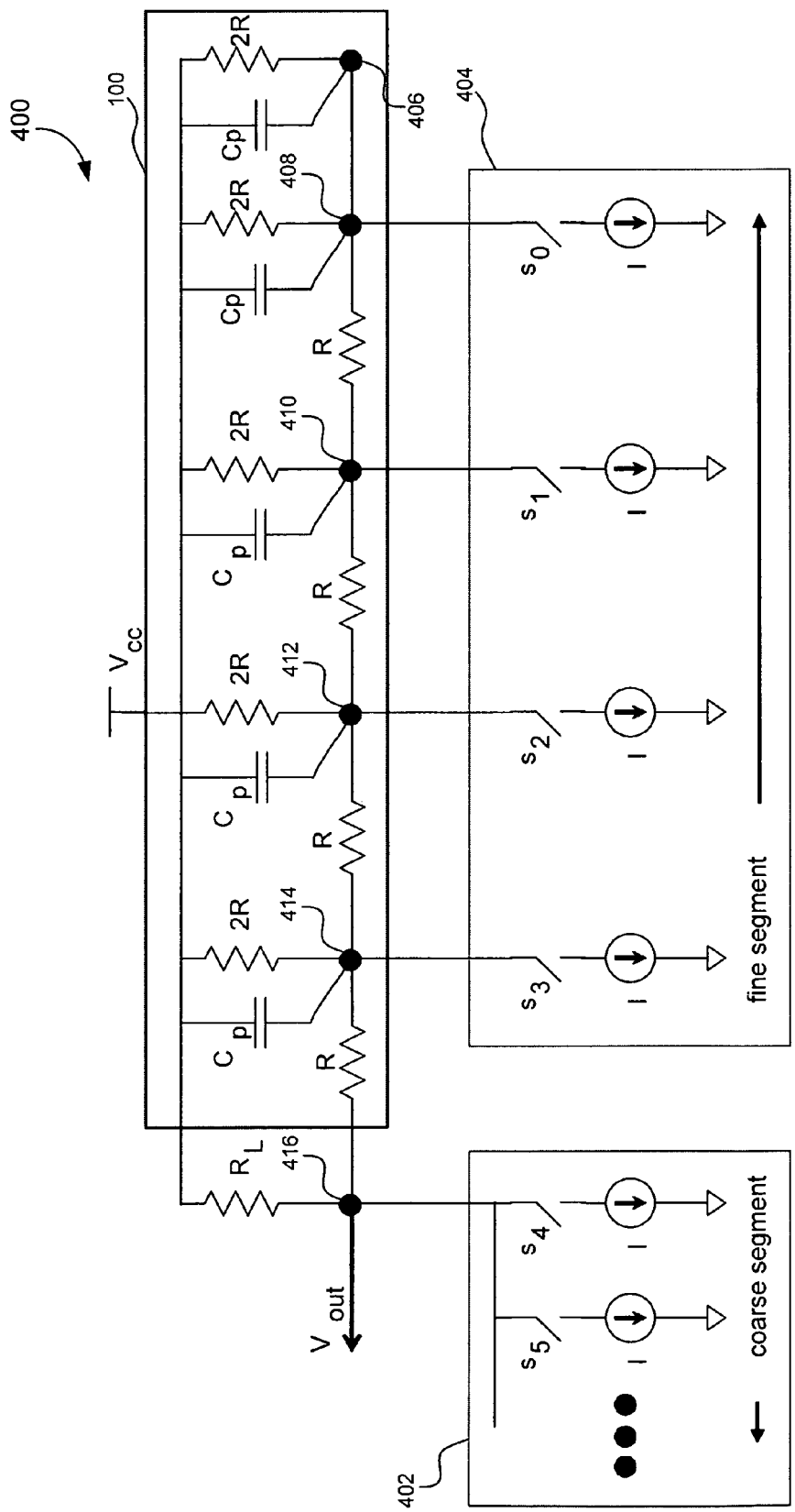
FIG. 5 is a schematic diagram of the DAC 400, wherein parasitic capacitances are illustrated as capacitors Cp.

FIG. 5 is a schematic diagram of the DAC 400, wherein the parasitic capacitances are illustrated as capacitors Cp. The parasitic capacitances associated with the injection nodes 406–416 cause different propagation delays from the unary current sources to the output node 416, in both the coarse and fine segments 402 and 404. The different delays contribute non-linear artifacts in the output waveform. Delay mismatches increase with increasing numbers of bits, and with increasing DAC speeds, such as multi-giga samples per second DACs.

III. Z/2Z Ladder

In accordance with the invention, the ladder network 100 is modified to equalize and/or reduce the different delays that result from the parasitic capacitances Cp. In an embodiment, capacitors are coupled between each pair of adjacent nodes to equalize the propagation delay.

Figure 6:
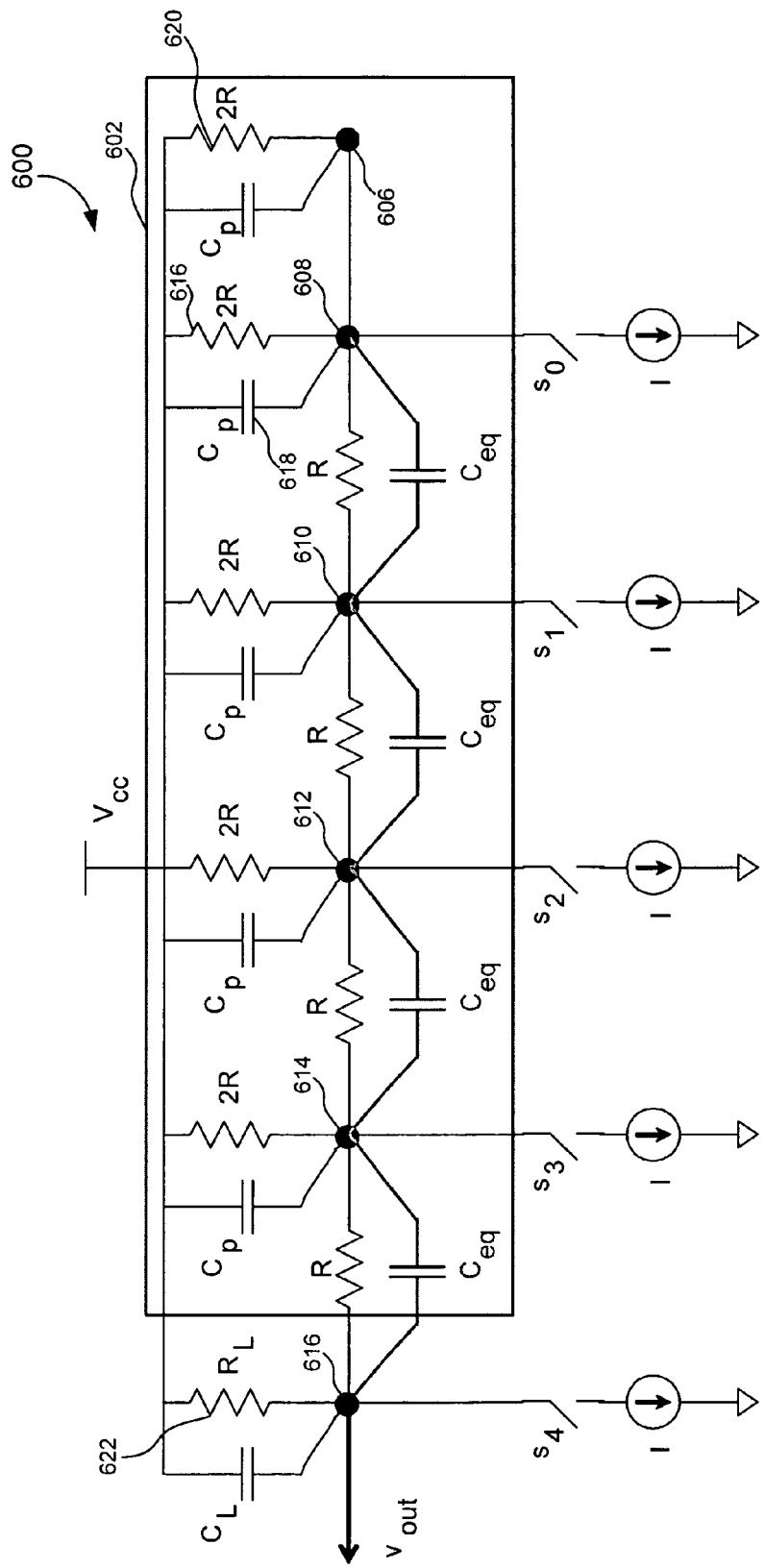
FIG. 6 is a schematic diagram of a DAC 600, including a Z/2Z ladder network 602.

For example, FIG. 6 is a schematic diagram of a DAC 600, with capacitors Ceq coupled between each pair of adjacent nodes 608 through 616. In an embodiment, the capacitances Ceq are substantially equal to 2Cp, where Cp is the total parasitic capacitance associated with each node 606 through 614.

With the addition of the capacitances Ceq, the R/2R ladder network becomes a Z/2Z ladder 602, where Z=(Ceq//R)=(Cp//2R)/2, where "//" indicates a parallel circuit structure. Since a 1:2 impedance ratio is maintained over the entire frequency band, the Z/2Z ladder 600 performs substantially the same binary current division function as the R/2R ladder 100, while equalizing the propagation delays to zero.

When Ceq is not exactly equal to 2Cp, simulations show that a DAC incorporating the Z-2Z ladder 602 degrades in linearity but can still tolerate the mismatch between Ceq and 2Cp in conventional IC technology. For example, in a 12 bit DAC running at 2.5 giga samples per second and having a 4 bit coarse segment and an 8 bit binary segment, where the 8 bit binary weights are generated by a Z/2Z ladder with parasitic capacitance Cp~40fF, the DAC output signal-to-noise ratio "(SNR)" degrades by only 2 dB from the ideal 73.76 dB for Ceq=2Cp+/−Cp.

Due to the relatively large mismatch tolerance, Ceq can be implemented with metal finger capacitors. The metal capacitors are optionally laid out on top of the poly resistors to help to reduce the poly self-heating.

In the example of FIG. 6, the DAC 600 utilizes unary current sources. Alternatively, the DAC 600 can utilize a voltage reference as described above with respect to FIG. 3.

In the example of FIG. 6, the node 616 is referred to as an output node, node 606/608 is referred to as a termination node, and nodes 610 through 614 are referred to as intermediate nodes. Resistor 620 is referred to as a termination resistor. Resistor 622 is referred to as a load resistor.

In the example of FIG. 6, the current sources S0 through S4 are illustrated as single-ended current sources. Alternatively, the current sources are differential current sources.

Figure 7:
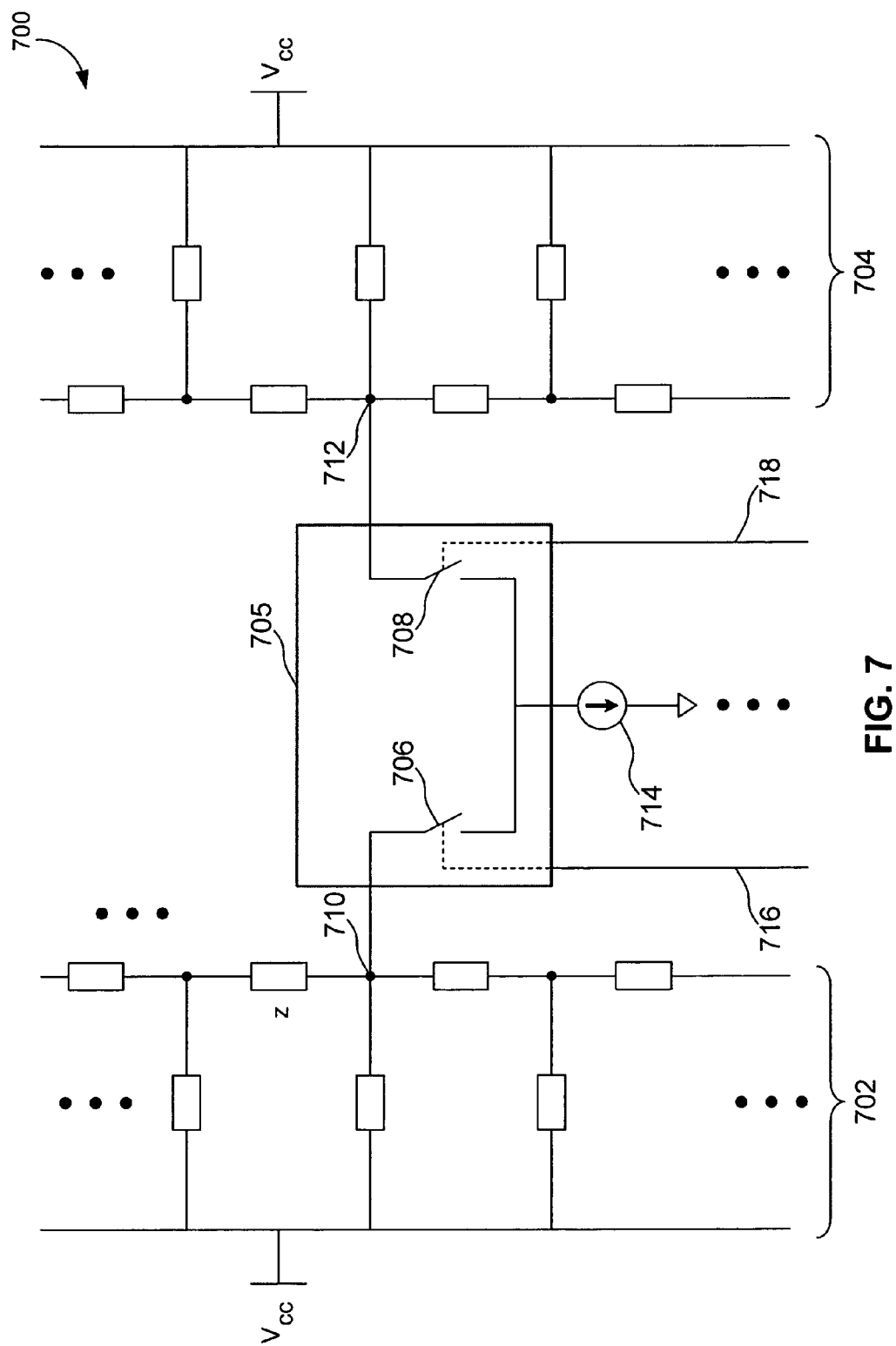
FIG. 7 is a schematic diagram of a differential DAC 700.

For example, FIG. 7 is a schematic diagram of a differential DAC 700, including a P-type Z/2Z ladder 702 and an N-type Z/2Z ladder 704. A differential switch 705 includes a pair of switches 706 and 708, which couples respective nodes 710 and 712 to a current source 714, under control of respective differential data control lines 716 and 718.

Figure 8:
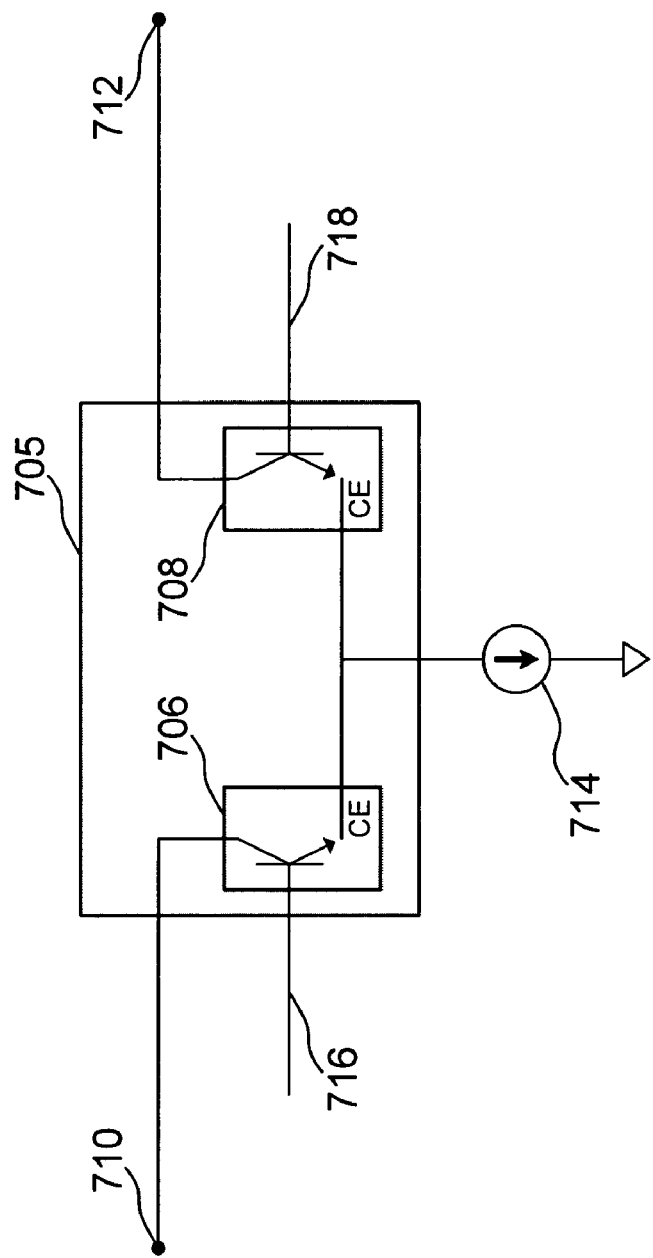
FIG. 8 is a schematic diagram of a differential switch within the differential DAC 700.

FIG. 8 is a schematic diagram of the differential switch 705, wherein the switches 706 and 708 are implemented with bi-polar devices. The switches 706 and 708 are not, however, limited to implementation with bi-polar devices.

The invention can be implemented with R/nR ladder networks, where n is an integer. In an embodiment, n is an even integer. The invention is not, however, limited to even values of n.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components and/or integrated circuits.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

The Detailed Description section should primarily be used to interpret the claims. The Summary and Abstract sections may set forth one or more, but not all, exemplary embodiments of the present invention as contemplated by the inventor(s), and thus, are not intended to limit the claims.

What is claimed is:

1. An impedance ladder circuit, comprising:

a series connection of n first resistors each having a resistance R, each adjacent pair of the first resistors defining an intermediate node there between, the series of n first resistors defining an output node at a first end and a termination node at a second end;

n second resistors each having a resistance substantially equal to 2R, each second resistor coupled between a respective one of the intermediate nodes and a reference and between the termination node and the reference;

a termination resistor substantially equal to 2R coupled between the termination node and the reference in parallel with one of the second resistors; and n capacitors, each coupled in parallel with a respective one of the first resistors;

wherein each intermediate node and the termination node has a parasitic capacitance Cp, and wherein each of the n capacitors have a capacitance substantially equal to 2Cp.

2. The circuit according to claim 1, further comprising n switches, each switch coupled between a respective one of the intermediate nodes and a corresponding current source, and between the termination node and a corresponding current source.

3. The circuit according to claim 2, wherein the switches are controlled by digital bits.

4. The circuit according to claim 1, further comprising a load resistance coupled between the output node and the reference.

5. A digital to analog converter, comprising:

a series connection of n first resistors each having a resistance R, each adjacent pair of the first resistors defining an intermediate node there between, the series of n first resistors defining an output node at a first end and a termination node at a second end;

n second resistors each having a resistance substantially equal to 2R, each second resistor coupled between a respective one of the intermediate nodes and a reference, and between the termination node and the reference;

a termination resistor substantially equal to 2R coupled between the termination node and the reference in parallel with one of the second resistors;

n capacitors, each coupled in parallel with a respective one of the first resistors; and n+1 switches, each coupled between a respective one of the nodes and a respective current source, each said switch controlled by a corresponding digital bit, whereby the termination node switch is controlled by a least significant bit and the output node switch is controlled by a more significant bit;

wherein each intermediate node has an associated capacitance Cp, the termination node has a capacitance substantially equal to 2Cp; and each of the n capacitors have a capacitance substantially equal to 2Cp.

6. The circuit according to claim 5, wherein the n+1 switches are controlled by digital bits.

7. The circuit according to claim 5, further comprising:

a load resistance coupled between the output node and the reference; and one or more additional switches, each coupled between the output node and a respective current source.

8. The circuit according to claim 7, wherein the additional switches are controlled by a thermometer code generated from most significant bits.

9. An impedance ladder, comprising:

an R/2R ladder network;

capacitors coupled across series resistors within the R/2R ladder network;

wherein the capacitors are sized to substantially match delays from nodes within the R/2R ladder network to an output node;

wherein nodes within the R/2R ladder network include parasitic capacitances, wherein each of the capacitors is substantially equal to twice the parasitic capacitances of a corresponding node.

10. The impedance ladder according to claim 9, wherein resistors within the R/2R ladder network comprise poly resistors.

11. The impedance ladder according to claim 10, wherein the capacitors comprise metal finger capacitors.

12. The impedance ladder according to claim 11, wherein the metal finger capacitors are fabricated on top of the poly resistors.

13. The impedance ladder according to claim 9, further comprising a second R/2R ladder configured substantially similar to the first R/2R ladder, wherein the first and second R/2R ladders are coupled together by differentially controlled switches.

* * * * *